(12) United States Patent
Mottaez et al.

(10) Patent No.: US 8,826,218 B2
(45) Date of Patent: Sep. 2, 2014

(54) ACCURATE APPROXIMATION OF THE OBJECTIVE FUNCTION FOR SOLVING THE GATE-SIZING PROBLEM USING A NUMERICAL SOLVER

(71) Applicant: Synopsys, Inc., Mountain View, CA (US)

(72) Inventors: Amir H. Mottaez, Los Altos, CA (US); Mahesh A. Iyer, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/954,922

(22) Filed: Jul. 30, 2013

(65) Prior Publication Data
US 2014/0033161 A1    Jan. 30, 2014

Related U.S. Application Data

(63) Continuation-in-part of application No. 13/562,189, filed on Jul. 30, 2012.

(51) Int. Cl.
*G06F 17/50*    (2006.01)

(52) U.S. Cl.
USPC .......................................................... 716/132

(58) Field of Classification Search
None
See application file for complete search history.

(56) References Cited

U.S. PATENT DOCUMENTS

| | | | |
|---|---|---|---|
| 6,282,693 B1 * | 8/2001 | Naylor et al. | 716/114 |
| 6,301,693 B1 * | 10/2001 | Naylor et al. | 716/114 |
| 6,662,348 B1 * | 12/2003 | Naylor et al. | 716/114 |
| 6,671,859 B1 * | 12/2003 | Naylor et al. | 716/113 |
| 6,785,875 B2 | 8/2004 | Beerel et al. | |
| 6,854,096 B2 | 2/2005 | Eaton et al. | |
| 7,487,489 B2 | 2/2009 | Granik | |
| 8,296,710 B2 | 10/2012 | Liu et al. | |
| 2004/0103377 A1 | 5/2004 | Eaton et al. | |

OTHER PUBLICATIONS

Jonathan Richard Shewchuk, "An Introduction to the Conjugate Gradient Method Without the Agonizing Pain", School of Computer Science, Carnegie Mello University, Aug. 1994.

* cited by examiner

*Primary Examiner* — A. M. Thompson
(74) *Attorney, Agent, or Firm* — Park, Vaughan, Fleming & Dowler LLP; Laxman Sahasrabuddhe (57) ABSTRACT

Systems and techniques are described for optimizing a circuit design by using a numerical solver. Some embodiments construct a set of lower bound expressions for a parameter that is used in an approximation of an objective function. Next, the embodiments evaluate the set of lower bound expressions to obtain a set of lower bound values. The embodiments then determine a maximum lower bound value from the set of lower bound values. Next, while solving a gate sizing problem using the numerical solver, the embodiments evaluate the approximate objective function and the partial derivatives of the approximate objective function by using the maximum lower bound value of the parameter. The maximum lower bound value of this parameter determines the accuracy of the approximation of the objective function.

15 Claims, 6 Drawing Sheets

FIG. 5

ACCURATE APPROXIMATION OF THE OBJECTIVE FUNCTION FOR SOLVING THE GATE-SIZING PROBLEM USING A NUMERICAL SOLVER

RELATED APPLICATION

This application is a continuation-in-part of U.S. patent application Ser. No. 13/562,189, entitled "Determining optimal gate sizes by using a numerical solver," by the same inventors, filed 30 Jul. 2012, the contents of which are herein incorporated by reference.

BACKGROUND

1. Technical Field

This disclosure relates to electronic design automation (EDA). More specifically, this disclosure relates to an accurate approximation of the objective function for solving the gate-sizing problem using a numerical solver.

2. Related Art

The goal of circuit synthesis is to convert a high-level description of a circuit design into an implementation that meets a set of timing constraints, and at the same time optionally optimizes one or more metrics, such as area, leakage power, etc.

Some circuit synthesis approaches create an initial circuit design at a given abstraction level (e.g., a logical or physical design). Next, a cell is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell," "sizing the gate," etc.). For each replacement cell size that is tried, the circuit synthesis approach updates timing information, and rejects cell sizes for which one or more timing constraints are violated. The iterative optimization process typically terminates after the optimization process has executed for a certain number of iterations or for a certain amount of time. One aspect that further makes this process computationally expensive is that modern technology libraries have many sizes associated with each gate type with carrying driving capability and/or multiple threshold voltages.

Unfortunately, such iterative trial-and-error based circuit synthesis approaches either take too long to complete and/or produce poor quality results for large circuit designs in which timing constraints are checked across many process corners and modes.

A circuit synthesis approach that is different from iterative trial-and-error approaches is described in Ivan Sutherland, Robert F. Sproull, and David Harris, *Logical Effort: Designing Fast CMOS Circuits*, Morgan Kaufmann, 1999. The cell delay can be represented using the following expression:

$$d = R \cdot C_o + p, \tag{1}$$

where, R is the output resistance of the cell, $C_o$ is the output loading, and p is the parasitic delay of the cell. Equation (1) can then be rewritten as:

$$d = (R \cdot C_i) \cdot \left(\frac{C_o}{C_i}\right) + p, \tag{2}$$

where, $C_i$ is the input capacitance presented by the cell at one of its input terminals.

The circuit synthesis approach described in Sutherland uses the following linear cell delay model:

$$d = g \cdot h + p, \tag{3}$$

where, g represents the logical effort, h represents the electrical effort, and p represents the parasitic delay of the cell. The logical effort captures the effect of the cell's topology on its ability to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate. The logical effort g and the parasitic delay p can be normalized, e.g., they can be normalized with respect to the logical effort and parasitic delay values, respectively, of a reference inverter.

Comparing Equations (2) and (3) we note that the first term $(R \cdot C_i)$ represents the logical effort g, and the second term $$\left(\frac{C_o}{C_i}\right)$$

represents the electrical effort h.

The delay model that is used by a circuit synthesis approach must be accurate, i.e., it must accurately model the actual cell delays. If the delay model is inaccurate, the circuit implementation produced by the circuit synthesis approach will likely contain many timing violations. In the above-mentioned work by Sutherland et al., the authors state that the linear delay model is approximate, i.e., it does not accurately model the actual cell delays.

SUMMARY

Some embodiments described herein provide techniques and systems for determining optimal gate sizes by using a numerical solver. The gates sizes are optimized by modeling a set of gate optimization problems and solving the set of gate optimization problems by using a numerical solver (e.g., a conjugate-gradient based numerical solver). The objective function for the gate optimization problem can minimize the maximum delay in the circuit design. Specifically, the objective function can be expressed using the "max" function that outputs the maximum delay.

Note that the "max" function is not differentiable. For numerical solvers (e.g., conjugate-gradient based numerical solvers) that require the objective function to be differentiable, a differentiable function that approximates the behavior of the "max" function can be used instead of the non-differentiable "max" function. One such function is called the "log-sum-exp" function, which uses a parameter a that determines how well the "log-sum-exp" function approximates the "max" function. Specifically, the approximation can be made arbitrarily accurate by decreasing the value of α. Unfortunately, decreasing the value of a can also cause overflow or underflow errors in the numerical solver.

Some embodiments described herein compute the smallest α value that is guaranteed to prevent overflow or underflow errors while solving the gate sizing problem using the numerical solver. Specifically, some embodiments construct a set of lower bound expressions for parameter α that is used in an objective function, wherein the set of lower bound expressions are constructed based on the objective function, partial derivatives of the objective function, the maximum value that the computing architecture can handle and/or the numerical solver can handle, and the minimum value that the computing architecture can handle and/or the numerical solver can handle. Next, the embodiments evaluate the set of lower bound expressions to obtain a set of lower bound values. The embodiments then determine a maximum lower bound value from the set of lower bound values. Next, while solving a gate sizing problem using the numerical solver, the embodiments evaluate the objective function and the partial derivatives of the objective function by using the maximum lower bound value as the value of $\alpha$. Specifically, solving the gate sizing problem using the numerical solver can involve: evaluating the objective function, evaluating a gradient of the objective function, and providing values of the objective function and the gradient to the conjugate-gradient based numerical solver.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Numerical Synthesis

Figure 1:
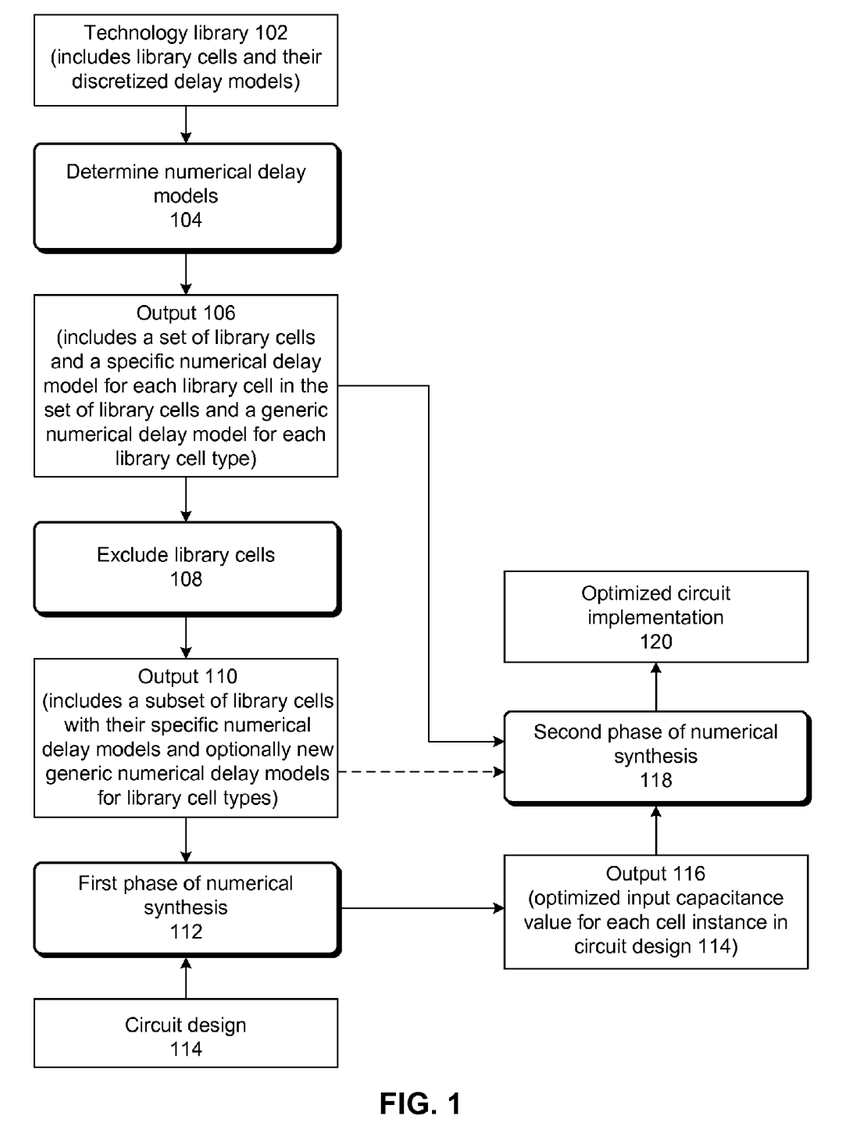
FIG. 1 illustrates a numerical synthesis process in accordance with some embodiments described herein.

FIG. 1 illustrates a numerical synthesis process in accordance with some embodiments described herein.

Technology library 102 includes library cells and discretized non-linear delay models for the library cells. The library cells in the technology library 102 can be used to create and/or optimize a circuit design. The term "library cell" refers to a cell in a technology library. The term "library cell" is to be distinguished from the term "cell instance" which is an instantiation of a library cell in a circuit design. In some embodiments, a discretized delay model models the delay for a timing arc of a library cell.

The term "library cell type" refers to a particular logical functionality. Examples of functionalities include, but are not limited to, "AND," "OR," "XOR," "multiplexor," etc. The term "library cell" refers to a particular implementation of a library cell type. A technology library can be viewed as a collection of library cells of one or more library cell types. For example, a technology library may include multiple sizes of an inverter. In this example, the term "inverter" is the library cell type, and the term "library cell" refers to an inverter implementation of a particular size.

A numerical delay model is a delay model that can be used by a numerical solver to optimize a cost function. A linear delay model is one example of a numerical delay model. More generally, an analytical formula that represents the delay behavior is an example of a numerical delay model.

The term "specific numerical delay model" refers to a numerical delay model that models the delay behavior of a particular timing arc of a particular library cell, or the delay behavior of a particular library cell. A specific numerical delay model is defined using a specific logical effort value and a specific parasitic delay value.

The term "generic numerical delay model" refers to a numerical delay model that models an aggregated delay behavior of either a timing arc of a library cell type or the library cell type itself. A generic numerical delay model is defined using a generic logical effort value and a generic parasitic delay value.

Examples of systems and techniques that can be used to determine specific and generic numerical delay models (which can be used to perform operation 104) are described in U.S. patent application Ser. No. 13/450,178, entitled "Numerical delay model for a technology library cell and/or a technology library cell type," the contents of which are herein incorporated by reference in their entirety.

Some embodiments determine numerical delay models based on technology library 102 (operation 104). Output 106 of operation 104 can include a set of library cells and a specific numerical delay model for each library cell in the set of library cells and a generic numerical delay model for each library cell type. The set of library cells in output 106 typically includes all library cells in technology library 102, but in some embodiments certain library cells may be removed if desired.

Certain library cells can then be excluded (operation 108) to obtain a subset of library cells. Each library cell in the subset of library cells has a specific numerical delay model that was computed in operation 104. In some embodiments, a new generic numerical delay model can be determined for each cell type based on the specific numerical delay models corresponding to the subset of library cells. These generic numerical delay models are "new" because they are based on the subset of library cells as opposed to being based on the set of library cells that were used in operation 104 to determine the generic numerical delay models. Output 110, i.e., the subset of library cells with their specific numerical delay models and optionally the new generic numerical delay models for the library cell types, can then be provided as input to the first phase of numerical synthesis 112.

Examples of systems and techniques that can be used to exclude library cells (which can be used to perform operation 108) are described in U.S. patent application Ser. No. 13/479,807, entitled "Excluding library cells for delay optimization in numerical synthesis," the contents of which are herein incorporated by reference in their entirety.

The first phase of numerical synthesis 112 sizes cells in circuit design 114 using the subset of library cells with their specific numerical delay models and the new generic numerical delay models. In some embodiments, the first phase of numerical synthesis 112 models a numerical optimization problem based on circuit design 114 and the specific and generic numerical models for the subset of library cells. Output 116 from the first phase of numerical synthesis 112 includes the numerically optimized size for each cell instance in circuit design 114. Specifically, in some embodiments, output 116 includes the numerically optimized (and desired) input capacitance value for each cell instance in the circuit design 114.

Output 116 is then provided as one of the inputs to the second phase of numerical synthesis 118. The other inputs to second phase of numerical synthesis 118 include the library cells in technology library 102 and output 106 which includes the numerical delay models that were generated by operation 104. The second phase of the numerical synthesis 118 then instantiates cells that have the numerically optimized and desired cell sizes in circuit design 114 to produce optimized circuit implementation 120 using the discrete library cells from the technology library. In particular, for each cell instance in circuit design 114, the second phase of numerical synthesis 118 selects a technology library cell that best matches the numerically optimized size, (if a technology library cell with exactly the optimized size is not available, a technology library cell with nearly the optimized size is selected) from the set of library cells that were part of output 106. In some embodiments, second phase of numerical synthesis 118 also receives output 110 as input (shown in FIG. 1 using a dashed line). Specifically, second phase of numerical synthesis 118 uses the fact that certain technology library cells were excluded from output 106 to determine which cells to instantiate. If the user marks certain technology library cells as "do not use" cells, then the optimization process does not use them.

The reason a subset of technology library cells is used in the first phase and the set of all technology library cells is used in the second phase is as follows. The first phase determines numerically optimized cell sizes by solving a numerical optimization problem. In this phase, it is desirable to restrict the search space to technology library cells that can be accurately modeled using a logical effort and parasitic delay based numerical modeling approach. Therefore, a subset of technology library cells is used in this phase to restrict the search space. Once the numerically optimized cell sizes have been determined, it is important to enable the circuit synthesis process to select cell instances from a wide range of technology library cells. Therefore, in the second phase, the restriction on the search space is relaxed and the set of technology library cells that was in output 106 is used.

In general, gates can be optimized in any arbitrary order. Some embodiments described herein optimize gates in a reverse-levelized order so that, when a current set of gates are being optimized, the loads on those gates can be modeled accurately as fixed loads because those loads would have already been optimized in the current iteration. In a reverse-levelized processing order, each logic gate is associated with a level so that each logic gate's level is greater than the highest level associated with logic gates that are electrically coupled to the logic gate's fan-in. Optimizing gates in reverse-levelized order means that the gates are optimized in decreasing order of their levels, i.e., a gate at level n−1 will only be optimized after all gates at level n have been optimized. Gates at the same level may be optimized in any arbitrary order.

Figure 2:
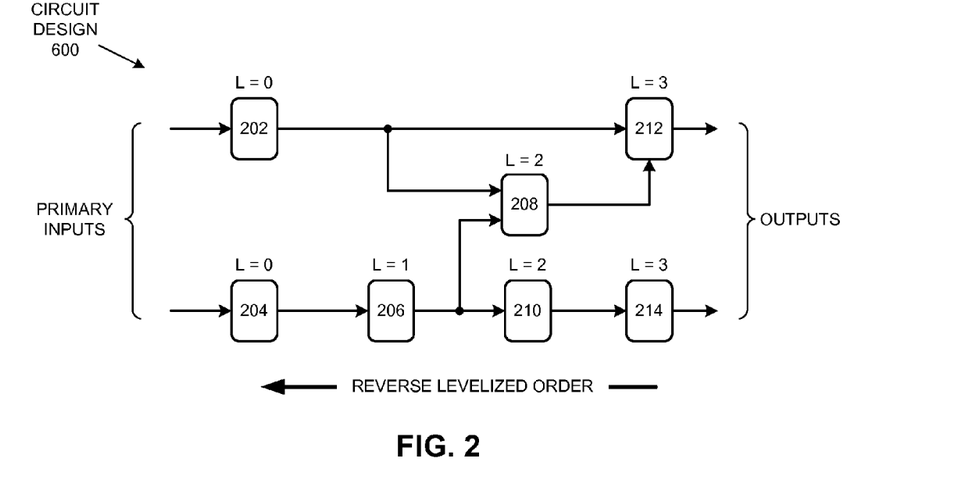
FIG. 2 illustrates a reverse-levelized processing order in accordance with some embodiments described herein.

FIG. 2 illustrates a reverse-levelized processing order in accordance with some embodiments described herein. In the figure, the notation "L=n," where n is a number denotes that the level associated with the logic gate is equal to n. Circuit design 200 includes logic gates 202-214 that have been assigned levels 0 through 3. Logic gates 202-204, whose fan-in is coupled to a primary input of the circuit design, are assigned level 0. All other logic gates are assigned a level that is greater than the highest level associated with the logic gates that are electrically coupled to the logic gate's fan-in. For example, logic gate 206 is assigned level 1, logic gates 208-210 are assigned level 2, and logic gates 212-214 are assigned level 3. In a reverse-levelized optimization order, the optimization process optimizes logic gates in decreasing order of their levels. For example, some embodiments described herein would optimize logic gates 212 and 214 before optimizing logic gates 208 and 210, and so forth.

The above description of the reverse-levelized order was provided for illustration purposes only, and is not intended to limit the embodiments described herein to a particular gate optimization order. It will be apparent to a person having ordinary skill in the art that the gates can be optimized in any desired order.

Modeling the Gate Optimization Problem

Figure 3A:
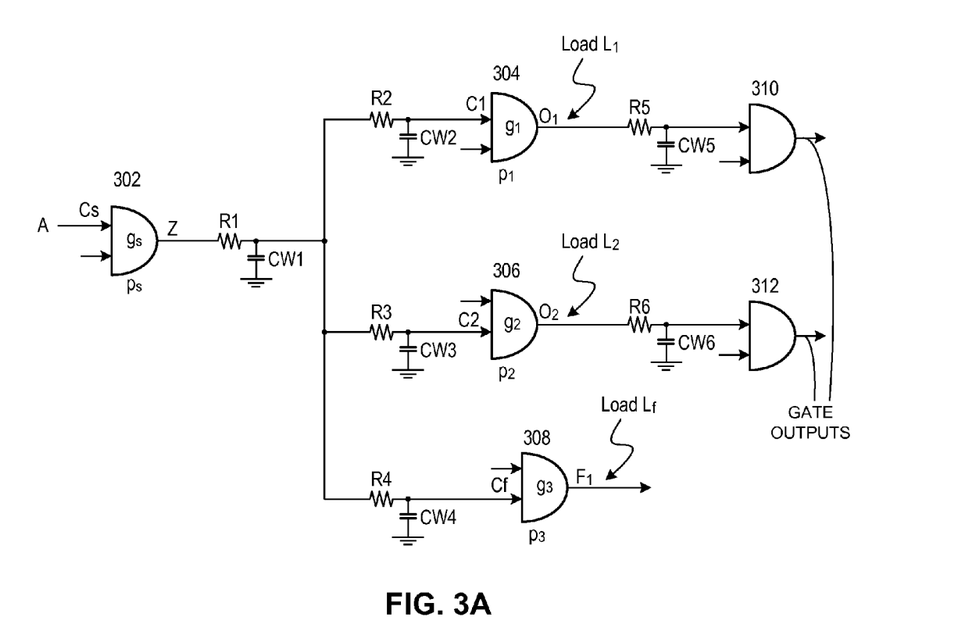
FIG. 3A how a gate optimization problem can be modeled in accordance with some embodiments described herein.

FIG. 3A how a gate optimization problem can be modeled in accordance with some embodiments described herein.

The portion of the circuit design shown in FIG. 3A includes gates 302, 304, 306, 308, 310, and 312. The gates shown in FIG. 3A can have any logic functionality, i.e., the gate symbols used in FIG. 3A do not correspond to a particular logic function. Furthermore, although only two inputs and one output is shown per gate in FIG. 3A, these gates can generally have one or more inputs and one or more outputs. The output of driver gate 302 is electrically connected to the inputs of gates 304, 306, and 308. The outputs of gates 304 and 306 are electrically connected to the inputs of gates 310 and 312, respectively. The electrical behavior of the wires that electrically connect outputs and inputs is modeled using a network of resistances and capacitances as shown in FIG. 3A. For example, the electrical behavior of the wire that electrically connects the output of driver gate 302 with the inputs of gates 304, 306, and 308 is modeled using a network of resistances R1-R4 and capacitances CW1-CW4 Likewise the electrical behavior of the wire that electrically connects the output of gate 304 with the input of gate 310 is modeled using resistance R5 and capacitance CW5, and the electrical behavior of the wire that electrically connects the output of gate 306 with the input of gate 312 is modeled using resistance R6 and capacitance CW6.

The input capacitances (i.e., of the inputs shown in FIG. 3A) of gates 302-308 are Cs, C1, C2, and Cf, respectively. The labels $O_1$, $O_2$, and $F_1$ correspond to the output pins of gates 304, 306, and 308, respectively. The loads at $O_1$, $O_2$, and $F_1$, are $L_1$, $L_2$, and $L_f$, respectively. The generic logical effort values for gates 304 and 306 are $g_1$ and $g_2$, respectively. The generic parasitic delay values for gates 304 and 306 are $p_1$ and $p_2$, respectively. The specific logical effort and parasitic delay values for gate 302 are $g_s$ and $p_s$, respectively. The specific logical effort and parasitic delay values for gate 308 are $g_3$ and $p_3$, respectively.

Delays from pin A to output pins $O_1$, $O_2$, and $F_1$, are modeled as follows. Let the wire delays from pin Z to pins $O_1$, $O_2$, and $F_1$, be dw1, dw2, and dw3. The wire delays dw1, dw2, and dw3 can be modeled using an Elmore delay model. Systems and techniques for efficiently computing Elmore wire delay are described in U.S. patent application Ser. No. 13/485,600, entitled "Incremental Elmore delay calculation," the contents of which are herein incorporated by reference in their entirety. Specifically, let CWT=CW1+CW2+CW3+CW4. Delay dw1 can be modeled as dw1=τ1+B11·C1+B12·C2, where, $\tau 1 = R1 \cdot (CWT + Cf) + R2 \cdot CW2$, $B11 = (R1+R2)$, and $B12 = R1$. (4)

Likewise, delays dw2 and dw3 can be modeled as dw2=τ2+B21·C1+B22·C2 and dw3=τ3+B31·C1+B32·C2, respectively, where, $\tau 2 = R1 \cdot (CWT + Cf) + R3 \cdot CW3$, $B21 = R1$, $B22 = R1 + R3$, $\tau 3 = R1 \cdot (CWT + Cf) + R4 \cdot (CW4 + Cf)$, $B31 = R1$, and $B32 = R2$. (5)

Let the delays from pin A to output pins $O_1$, $O_2$, and $F_1$, be $f_1$, $f_2$, and $f_3$, respectively. Delay $f_1$ can be expressed as follows:

$$f_1 = \frac{g_s}{Cs} \cdot (CWT + C1 + C2 + Cf) + p_s + dw1 + \frac{g_1}{C1} \cdot L_1 + p_1 \quad (6)$$

$$= \frac{g_s}{Cs} \cdot (CWT + Cf) + \tau 1 + p_s + p_1 + \left(\frac{g_s}{Cs} + B11\right) \cdot C1 + \left(\frac{g_s}{Cs} + B12\right) \cdot C2 + \frac{g_1 \cdot L_1}{C1}.$$

Equation (6) can be rewritten as:

$$f_1 = K1 + A11 \cdot C1 + A12 \cdot C2 + \frac{\phi 1}{C1}, \quad (7)$$

where, $$K1 = \frac{g_s}{Cs} \cdot (CWT + Cf) + \tau 1 + p_s + p_1, \quad (8)$$

$$A11 = \frac{g_s}{Cs} + B11,$$

$$A12 = \frac{g_s}{Cs} + B12, \text{ and}$$

$$\phi 1 = g_1 \cdot L_1.$$

Likewise, $f_2$ can be expressed as follows:

$$f_2 = K2 + A21 \cdot C1 + A22 \cdot C2 + \frac{\phi 2}{C2}, \quad (9)$$

where, $$K2 = \frac{g_s}{Cs} \cdot (CWT + Cf) + \tau 2 + p_s + p_2, \quad (10)$$

$$A21 = \frac{g_s}{Cs} + B21,$$

$$A22 = \frac{g_s}{Cs} + B22,$$

and $$\phi 2 = g_2 \cdot L_2,$$

and, $f_3$ can be expressed as follows:

$$f_3 = K3 + A31 \cdot C1 + A32 \cdot C2, \quad (11)$$

where, $$K3 = \frac{g_s}{Cs} \cdot (CWT + Cf) + \tau 3 + \frac{g_3 \cdot L_f}{Cf} p_s + p_3, \quad (12)$$

$$A31 = \frac{g_s}{Cs} + B31,$$

and $$A32 = \frac{g_s}{Cs} + B32.$$

Let D1, D2, and D3 be the desired delays from pin A to pins $O_1$, $O_2$, and $F_1$, respectively. The objective function $f_c$ for the gate optimization problem can be defined as follows:

$f_c = \max[(f_1 - D1), (f_2 - D2), (f_3 - D3)]$, (13)

where, "max" is a function that outputs the maximum value from the set of values that are provided as arguments to the function. The term "$(f_3 - D3)$" in Equation (13) can limit the solver from arbitrarily increasing C1 and C2. Therefore, in some alternate embodiments, the objective function can be formulated without using the "$(f_3 - D3)$" term. In these embodiments, the capacitance CW4 and the capacitance Cf are still used for computing the delay of the driver gate and for computing wire delays from pins Z to pins $O_1$ and $O_2$. The following discussion is based on the objective function shown in Equation (13).

If the numerical solver can handle non-differentiable objective functions (such as the "max" function), then the objection function shown in Equation (13) can be provided to the numerical solver to determine optimal gate sizes. For example, if a constraints solver is used to solve the optimization problem, then a differential objective function may not be required. However, some numerical solvers require that the objective function be differentiable. Specifically, the conjugate-gradient method requires that the objective function be differentiable. Further details of conjugate-gradient based numerical solvers can be found in M. R. Hestenes, and E. Stiefel, "Methods of Conjugate Gradients for Solving Linear Systems," Journal of Research of the National Bureau of Standards, Vol. 49, No. 6, pp. 409-436, December 1952, and W. C. Naylor, R. Donelly, L. Sha, "Non-linear optimization system and method for wire length and delay optimization for an automatic electronic circuit placer," U.S. Pat. No. 6,671,859, Dec. 30, 2003, the contents of which are incorporated by reference.

For numerical solvers that require a differentiable objective function, a differentiable function that approximates the behavior of the "max" function in Equation (13) can be used. For example, in some embodiments, the log-sum-exp differentiable function can be used to model the "max" function as follows:

$$f_c = \alpha \cdot \ln[e^{(f_1-D_1)/\alpha} + e^{(f_2-D_2)/\alpha} + e^{(f_3-D_3)/\alpha}]. \quad (14)$$

Some embodiments use a conjugate-gradient based numerical solver to determine the optimum gate sizes. For example, in FIG. 3A, a conjugate-gradient based numerical solver can be used to determine optimum gate sizes for gates 304 and 306 by determining the optimum input capacitance values C1 and C2, respectively. Specifically, the following expressions can be used to compute the partial derivatives of the objective function $f_c$ with respect to capacitances C1 and C2:

$$\frac{\partial f_c}{\partial C1} = \frac{e^{(f_1-D_1)/\alpha} \cdot \left(A11 - \frac{\phi 1}{(C1)^2}\right) + e^{(f_2-D_2)/\alpha} \cdot A21 + e^{(f_3-D_3)/\alpha} \cdot A31}{e^{(f_1-D_1)/\alpha} + e^{(f_2-D_2)/\alpha} + e^{(f_3-D_3)/\alpha}}, \quad (15)$$

and $$\frac{\partial f_c}{\partial C2} = \frac{e^{(f_1-D_1)/\alpha} \cdot A12 + e^{(f_2-D_2)/\alpha} \cdot \left(A22 - \frac{\phi 2}{(C2)^2}\right) + e^{(f_3-D_3)/\alpha} \cdot A32}{e^{(f_1-D_1)/\alpha} + e^{(f_2-D_2)/\alpha} + e^{(f_3-D_3)/\alpha}}. \quad (16)$$

A conjugate-gradient based numerical solver iteratively optimizes the objective function. In each iteration of the numerical solver, the current values of capacitances C1 and C2 are used to determine the partial derivatives (e.g., by using Equations (15)-(16)), and the partial derivatives are used to determine a new set of values for capacitances C1 and C2. The numerical solver outputs a solution when a termination condition is reached. For example, the numerical solver may output a solution when the relative and/or absolute change in the solution vector (e.g., the capacitances C1 and C2) is less than a pre-determined threshold. It will be apparent to a person having ordinary skill in the art that other termination conditions (e.g., a time limit, an iteration limit, etc.) can also be used either separately or in concert. Note that the partial derivatives can be computed incrementally, e.g., by computing the values of certain terms in Equations (15)-(16) only once and then reusing the values of those terms in subsequent calls to the conjugate-gradient solver.

The numerical solver can converge faster if a seed that is close to the optimal solution is provided to the numerical solver. Some embodiments use a closed analytical expression to estimate optimal sizes of the input capacitances of the gates that are being optimized (e.g., capacitances C1 and C2 in FIG. 3A), and provide the estimated input capacitance values as a seed (i.e., a starting point) to the numerical solver. Systems and techniques for estimating gate sizes are described in U.S. patent application Ser. No. 13/537,880, entitled "Estimating optimal gate sizes by using numerical delay models," the contents of which are herein incorporated by reference in their entirety.

Figure 3B:
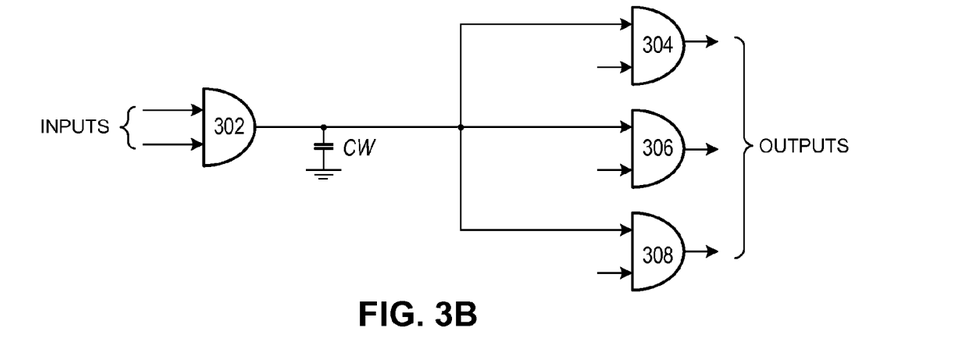
FIGS. 3B-3D illustrate a best case wire load model, a worst case wire load model, and a balanced-tree wire load model, respectively, in accordance with some embodiments described herein.
Figure 3C:
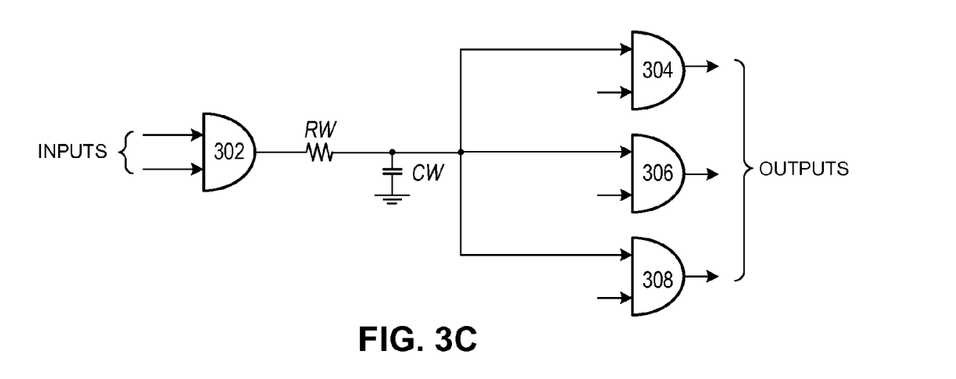
Figure 3D:
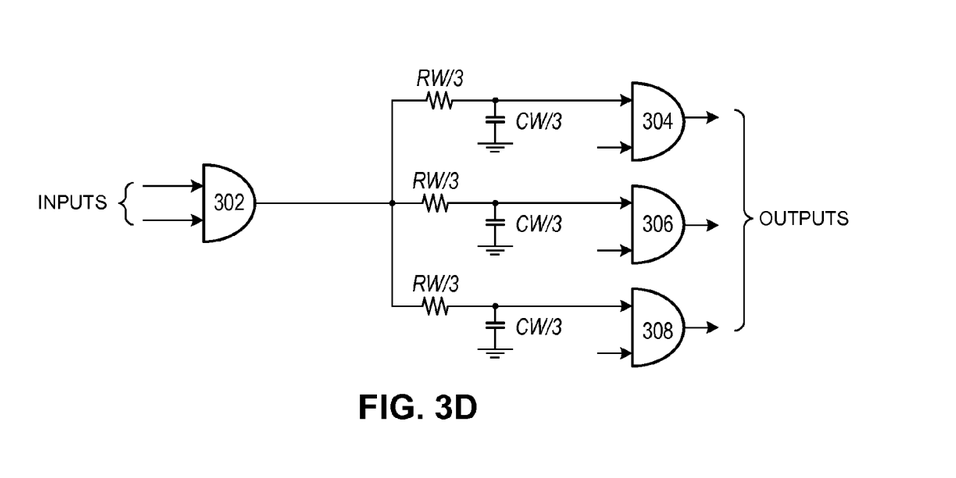

Although some embodiments described herein used the Elmore wire load model, the systems and techniques described in this disclosure can generally use any wire load model. Specifically, the systems and techniques described herein can use a best case wire load model (which is a model that ignores the wire resistance and models the wire load using a single lumped capacitance), a worst case wire load model (which is a model that uses a lumped resistance and a lumped capacitance to model the wire load), and a balanced-tree wire load model (which is a model that distributes the total capacitance and resistance of the wire equally across each branch, and uses a lumped capacitance and lumped resistance to model the wire load of each branch). FIGS. 3B-3D illustrate a best case wire load model, a worst case wire load model, and a balanced-tree wire load model, respectively, in accordance with some embodiments described herein. In FIGS. 3B-3D, RW is the wire resistance and the CW is the wire capacitance.

The plot of the objective function shown in Equation (14) has two or more substantially linear regions that have different slopes, and that are connected by curves. The constant α is a scaling factor that affects the smoothness of the curve as the function transitions from one substantially linear region to another.

For large values of α, the connecting curves are wide (i.e., the curves have a large radius of curvature). As α gets smaller, the connecting curves become tighter (i.e., the curves have a small radius of curvature). The function shown in Equation (14) can be made to model the non-differentiable "max" function with an arbitrary level of accuracy by making α arbitrarily small. However, decreasing α can increase the amount of time that the numerical solver requires to converge to a solution. In fact, if α is too small, it can prevent the numerical solver from converging to a solution altogether, e.g., because the numerical solver may overflow while trying to divide by a very small α value, that is limited by what the computing architecture offers. Some embodiments described herein use an optimal value of a that is small enough so that the objective function shown in Equation (14) models the "max" function with sufficient accuracy, and is large enough so that the numerical solver is able to converge to a solution within a reasonable amount of time. Specifically, a technique for computing the optimal value of α is now described.

The objective function $f_c$ for the N gate case can be expressed as follows:

$$f_c = \alpha \ln\left(\sum_{i \in [1,N]} e^{(f_i - D_i)/\alpha}\right), \quad (17)$$

where $f_i$ is the delay from the input pin of the driver gate to the output pin of gate i, and $D_i$ is the required delay from the input pin of the driver gate to the output pin of gate i, $1 \leq i \leq N$.

The partial derivatives of the objective function for the N gate case can be expressed as follows:

$$\frac{\partial f_c}{\partial C_k} = \frac{\sum_{i \in [1,N]} (e^{(f_i - D_i)/\alpha} \cdot \theta(i,k))}{\sum_{i \in [1,N]} e^{(f_i - D_i)/\alpha}}, \quad (18)$$

where $\theta(i,k) = A_i^k$ when $i \neq k$, and $\theta(i,k) = (A_k^k - \phi_k / C_k^2)$ when $i = k$. Note that, in Equation (18), the $A_i^k$ values correspond to the A11, A12, etc. values that were described above. Likewise, the $C_k$ input capacitance values correspond to the C1, C2, etc. input capacitances that were described above.

Let $Q_{max}$=MAX_VAL/N, where MAX_VAL is the largest value that can be handled by the numerical solver (i.e., a value greater than MAX_VAL would cause an overflow error). If we ensure that each of the N terms in Equation (17) and similarly each of the N terms in Equation (18) are less than $Q_{max}$, then we will ensure that the objective function and the partial derivatives will not cause an overflow.

Specifically, in Equation (17), if the inequality $Q_{max} \geq e^{(f_i - D_i)/\alpha}$ holds for all i, then the value of the objective function $f_c$ will not overflow. Taking a natural logarithm on both sides of the inequality $Q_{max} \geq e^{(f_i - D_i)/\alpha}$, and then rearranging the terms and expanding $f_i$ (e.g., see Equation (6)) we obtain the following inequality:

$$\alpha \geq \frac{w_i + \left(\sum_{j \in [1,N]} C_j \cdot A_i^j\right) + \frac{\phi_i}{C_i} - D_i}{\ln(Q_{max})}, \quad (19)$$

where $w_i$ includes constant terms (i.e., terms that are not dependent on $C_i$ or $C_j$).

If the inequality shown in Equation (19) holds for all i, then the value of the objective function will not overflow. Note that the maximum value of the right hand side (RHS) in Equation (19) provides us with a lower bound for a. The RHS in Equation (19) attains the maximum value when either (a) the largest $C_j$ and the smallest $C_i$ are used when $j \neq i$, or (b) the largest $C_j$ and the largest $C_i$ are used. Therefore, to determine the lower bound based on Equation (19), we can compute the value of the RHS for cases (a) and (b), and the maximum of these two values will be one of the lower bounds on α.

Using a similar approach as above, the following lower bound expressions can be obtained by analyzing the partial derivative Equation (18). Specifically, when $j \neq i$, the lower bound is given by:

$$\alpha \geq \frac{w_i + \left(\sum_{j \in [1,N]} C_j \cdot A_i^j\right) + \frac{\phi_i}{C_i} - D_i}{\ln\left(\frac{Q_{max}}{A_i^j}\right)}. \quad (20)$$

For the case when j=i, we have three subcases. The first subcase covers the situation where $$A_i^i - \frac{\phi_i}{C_i^2} > 0$$

for all $C_i$. For this subcase, the lower bound expression is as follows:

$$\alpha \geq \frac{w_i + \left(\sum_{j \in [1,N]} C_j \cdot A_i^j\right) + \frac{\phi_i}{C_i} - D_i}{\ln\left(\frac{Q_{max}}{A_i^i - \frac{\phi_i}{C_i^2}}\right)}. \quad (21)$$

The second subcase covers the situation where $$A_i^i - \frac{\phi_i}{C_i^2} < 0$$

for all $C_i$. For this subcase, the lower bound expression is as follows:

$$\alpha \geq \frac{w_i + \left(\sum_{j \in [1,N]} C_j \cdot A_i^j\right) + \frac{\phi_i}{C_i} - D_i}{\ln\left(\frac{Q_{min}}{\frac{\phi_i}{C_i^2} - A_i^i}\right)}, \quad (22)$$

where $Q_{min}$=|MIN_VAL| and MIN_VAL is the minimum value that can be represented in the underlying computing architecture and/or be handled by the numerical solver (i.e., a value less than MIN_VAL will cause an underflow error).

Finally, the third subcase covers the situation where $$A_i^i - \frac{\phi_i}{C_i^2} < 0$$

for some $C_i$, and $$A_i^i - \frac{\phi_i}{C_i^2} > 0$$

for other $C_i$. For this subcase, the lower bound is the maximum of the two lower bounds computed using the expressions for the first and second subcases (i.e., using Equations (20)-(21)).

Once all of the lower bounds have been computed for α, the maximum lower bound can be selected as the optimal value for α. Next, the optimal value of α can be used in the objective function (e.g., the objective function shown in Equation (17)).

Figure 4A:
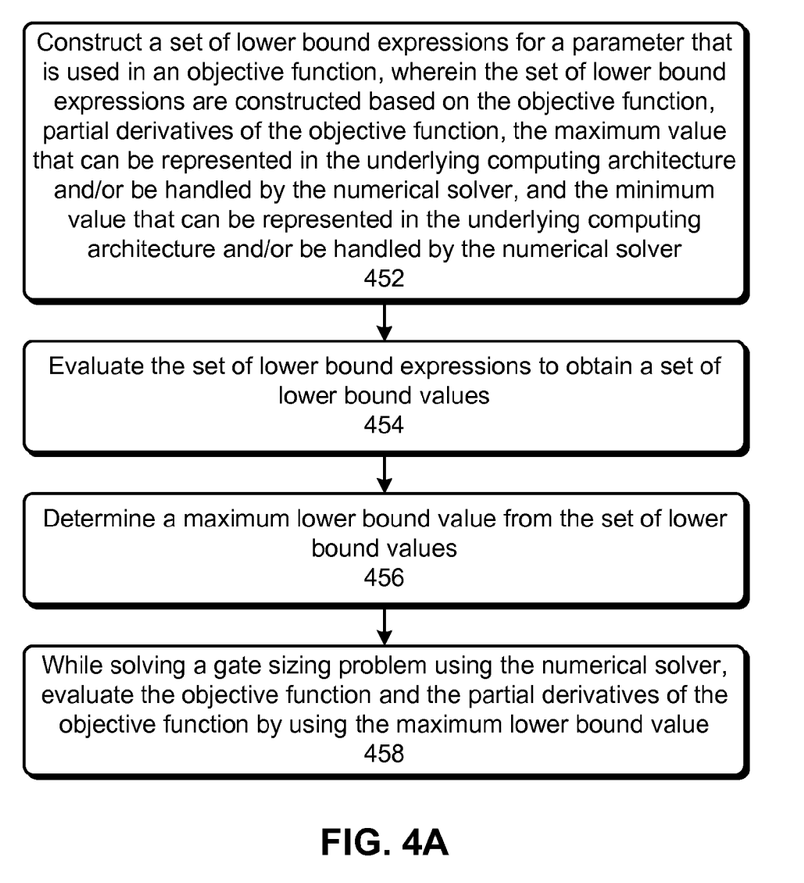
FIG. 4A illustrates a process for determining an optimal value for a parameter that is used in the objective function in accordance with some embodiments described herein.

FIG. 4A illustrates a process for determining an optimal value for a parameter that is used in the objective function in accordance with some embodiments described herein. The process begins with constructing a set of lower bound expressions for a parameter that is used in an objective function, wherein the set of lower bound expressions are constructed based on the objective function, partial derivatives of the objective function, the maximum value that can be represented in the underlying computing architecture and/or be handled by the numerical solver, and the minimum value that can be represented in the underlying computing architecture and/or be handled by the numerical solver (operation 452). Next, some embodiments can evaluate the set of lower bound expressions to obtain a set of lower bound values (operation 454). The embodiments can then determine a maximum lower bound value from the set of lower bound values (operation 456). Next, while solving a gate sizing problem using the numerical solver, the embodiments can evaluate the objective function and the partial derivatives of the objective function by using the maximum lower bound value for α (operation 458). The maximum lower bound value can be computed for each net that is optimized in the circuit design and stored. The numerical optimizer can reuse the stored maximum lower bound values whenever the net is optimized.

Figure 4B:
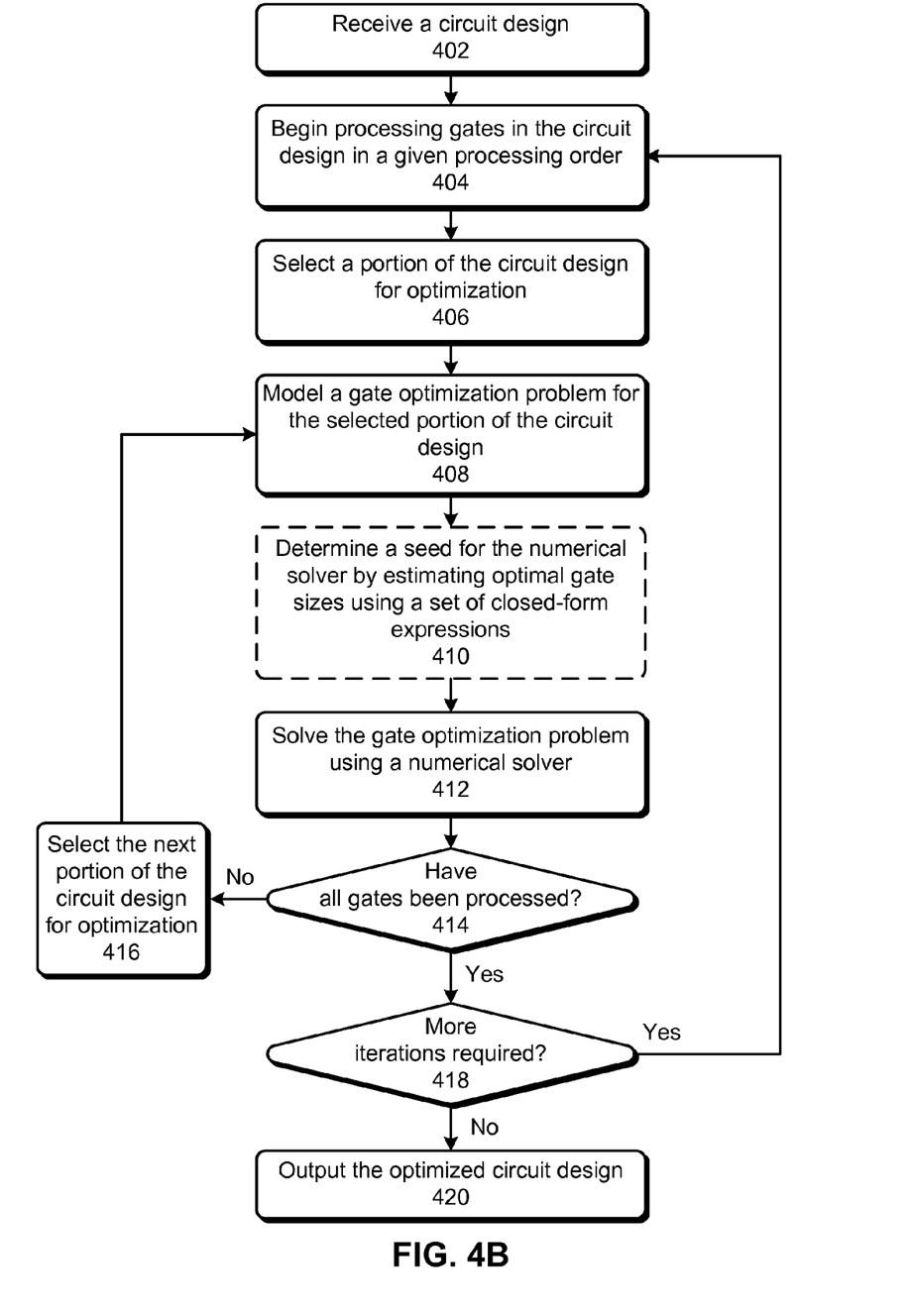
FIG. 4B illustrates a process for optimizing a circuit design in accordance with some embodiments described herein.

FIG. 4B illustrates a process for optimizing a circuit design in accordance with some embodiments described herein. An embodiment (e.g., a computer system) can perform the process, which begins by receiving a circuit design (operation 402). The circuit design can generally be at any abstraction level, e.g., the circuit design can be a logical design or a physical design.

Next, the embodiment begins processing gates in the circuit design in a given processing order (operation 404). For example, in some embodiments, the embodiment can process the gates in a reverse-levelized processing order as explained in reference to FIG. 2. The embodiment then selects a portion of the circuit design for optimization (operation 406). For example, the embodiment may select the portion of the circuit design shown in FIG. 3A for optimization.

Next, the embodiment can model a gate optimization problem for the selected portion of the circuit design (operation 408). Modeling the gate optimization problem can involve collecting (e.g., by retrieving values stored in memory locations) circuit information for the selected portion of the circuit design, and constructing expressions for determining values of entities that are required during optimization.

In some embodiments, the selected portion of the circuit design can include a driver gate that drives one or more inputs of each gate in a set of gates. In these embodiments, the collected circuit information can include generic logical effort values of each gate in the set of gates, an input capacitance value and a specific logical effort value of the driver gate, and wire resistance and capacitance values of a net that electrically connects an output of the driver gate with one or more inputs of each gate in the set of gates. The circuit information can further include a generic logical effort value for a virtual driver gate, and a fixed load value as seen by the virtual driver gate.

Embodiments that use a conjugate-gradient based numerical solver may construct expressions for computing the conjugate gradient (e.g., Equations (15)-(16)). Note that if the selected portion of the circuit design includes n gates that are being optimized simultaneously, then the embodiments compute n partial derivatives with respect to the n input capacitances corresponding to the n gates that are being optimized. Some or all parts of the "collecting information" operation and/or the "constructing expressions" operation can be performed once and then reused later if required.

The embodiment can then determine a seed for the numerical solver by estimating optimal gate sizes using a set of closed-form expressions (operation 410). Operation 410 is optional, i.e., some embodiments may directly proceed to operation 412 without performing operation 410. A seed is a starting point in the solution space. For example, if the numerical solver is simultaneously optimizing n gate sizes, then the seed could be a set of n input capacitances corresponding to the n gate sizes that are being optimized. In general, the closer the seed is to the optimal solution, the faster the numerical solver is expected to converge to the optimal solution. Some embodiments determine the seed by using the systems and techniques for estimating gate sizes that are described in U.S. patent application Ser. No. 13/537,880, entitled "Estimating optimal gate sizes by using numerical delay models."

Next, the embodiment solves the gate optimization problem using a numerical solver (operation 412). For example, some embodiments that use a conjugate-gradient based numerical solver can perform operation 412 as follows. The embodiments can determine the conjugate-gradient based on the collected circuit information. The conjugate gradient is defined by the set of partial derivatives of the objective function (e.g., Equation (14)) with respect to the variables (e.g., input capacitances C1 and C2 of gates 304 and 306, respectively) that are being optimized. Next, the embodiment can provide the value of the conjugate gradients as well as the value of the objective function to the numerical solver, and the numerical solver can return with a new set of values for the variables (e.g., input capacitances C1 and C2) that are being optimized. The embodiment can then compute the new conjugate gradients, and provide the new conjugate gradients and the value of the objective function to the numerical solver. This iterative search for the optimal solution can terminate when the difference in the objective function between successive solutions returned by the numerical solver is less than a given threshold.

Once the selected portion of the circuit design has been optimized, the embodiment can check if all gates have been processed (operation 414). If more gates need to be processed ("No" branch), then the embodiment can select the next portion of the circuit design for optimization (operation 416) and return to operation 408.

On the other hand, if all gates have been processed ("Yes" branch), then the embodiment can check if more iterations are required (operation 418). If no more iterations are required ("No" branch, e.g., because the gate sizes have converged to a substantially optimal value or some other termination condition has been met), then the embodiment can output the optimized circuit design (operation 420) that includes gates with the optimized gate sizes. On the other hand, if more iterations are required ("Yes" branch), the embodiment can return to operation 404 and begin processing gates in the circuit design in a given processing order (with the new gate sizes that were determined in the previous iteration).

Figure 5:
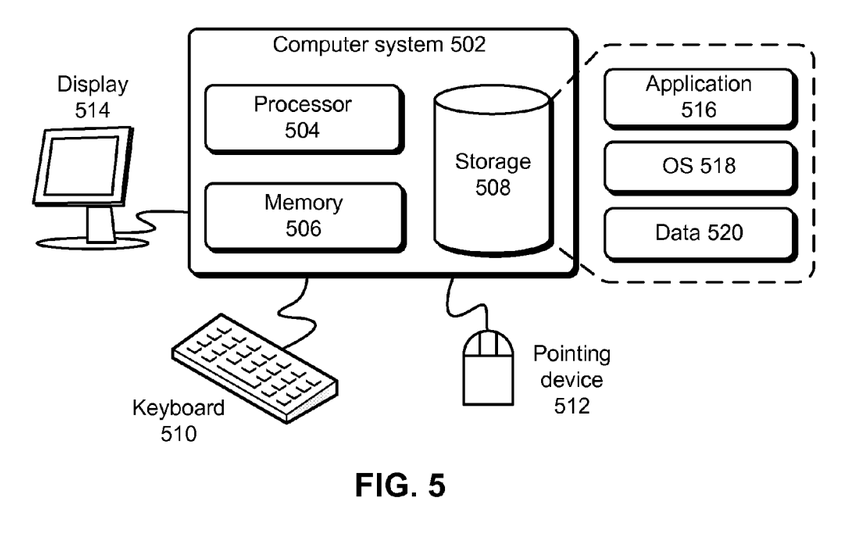
FIG. 5 illustrates a computer system in accordance with an embodiment of the present invention.

FIG. 5 illustrates a computer system in accordance with an embodiment of the present invention.

A computer system can generally be any system that can perform computations. Specifically, a computer system can be a microprocessor, an application specific integrated circuit, a distributed computing system, a cloud computing system, or any other computing system now known or later developed. Computer system 502 comprises processor 504, memory 506, and storage 508. Computer system 502 can be coupled with display 514, keyboard 510, and pointing device 512. Storage 508 can generally be any device that can store data. Specifically, a storage device can be a magnetic, an optical, or a magneto-optical storage device, or it can be based on flash memory and/or battery-backed up memory. Storage 508 can store application 516, operating system 518, and data 520.

Application 516 can include instructions that when executed by computer 502 cause computer 502 to perform one or more processes that are implicitly or explicitly described in this disclosure. Data 520 can include any data that is inputted into or outputted by application 516.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims

What is claimed is:

1. A method for optimizing a circuit design, the method comprising:
    constructing a set of lower bound expressions for a parameter that is used in an approximation of a log-sum-exp approximation of a maximum function that is part of an objective function, wherein the set of lower bound expressions are constructed based on the objective function, partial derivatives of the objective function, the maximum value that can be represented by a computing architecture of a computer and/or can be handled by a numerical solver, and the minimum value that can be represented in the computing architecture of the computer and/or handled by the numerical solver;
    evaluating the set of lower bound expressions to obtain a set of lower bound values;
    determining a maximum lower bound value from the set of lower bound values; and
    while a gate sizing problem is being solved by the numerical solver, evaluating the objective function and the partial derivatives of the objective function by using the maximum lower bound value.

2. The method of claim 1, wherein the numerical solver is a conjugate-gradient based numerical solver, and wherein the maximum lower bound value is computed for each net in the circuit design and reused in each numerical optimization iteration of the net.

3. The method of claim 2, wherein said solving the gate sizing problem in the numerical solver includes:
    evaluating the objective function;
    evaluating a gradient of the objective function; and
    providing values of the objective function and the gradient to the conjugate-gradient based numerical solver.

4. The method of claim 1, wherein the objective function is a differentiable objective function that optimizes delay in the circuit design.

5. The method of claim 1, wherein the objective function includes a differentiable approximation of a function that returns a maximum value from a set of input values.

6. A non-transitory computer-readable storage medium storing instructions that, when executed by a computer, cause the computer to perform a method for optimizing a circuit design, the method comprising:
    constructing a set of lower bound expressions for a parameter that is used in an approximation of a log-sum-exp approximation of a maximum function that is part of an objective function, wherein the set of lower bound expressions are constructed based on the objective function, partial derivatives of the objective function, the maximum value that can be represented by a computing architecture of the computer and/or can be handled by a numerical solver, and the minimum value that can be represented in the computing architecture of the computer and/or handled by the numerical solver;
    evaluating the set of lower bound expressions to obtain a set of lower bound values;
    determining a maximum lower bound value from the set of lower bound values; and
    while a gate sizing problem is being solved by the numerical solver, evaluating the objective function and the partial derivatives of the objective function by using the maximum lower bound value.

7. The non-transitory computer-readable storage medium of claim 6, wherein the numerical solver is a conjugate-gradient based numerical solver, and wherein the maximum lower bound value is computed for each net in the circuit design and reused in each numerical optimization iteration of the net.

8. The non-transitory computer-readable storage medium of claim 7, wherein said solving the gate sizing problem in the numerical solver includes:
    evaluating the objective function;
    evaluating a gradient of the objective function; and
    providing values of the objective function and the gradient to the conjugate-gradient based numerical solver.

9. The non-transitory computer-readable storage medium of claim 6, wherein the objective function is a differentiable objective function that optimizes delay in the circuit design.

10. The non-transitory computer-readable storage medium of claim 6, wherein the objective function includes a differentiable approximation of a function that returns a maximum value from a set of input values.

11. An apparatus, comprising:
    a processor; and
    a non-transitory computer-readable storage medium storing instructions that, when executed by the processor, cause the apparatus to perform a method for optimizing a circuit design, the method comprising:
        constructing a set of lower bound expressions for a parameter that is used in an approximation of a log-sum-exp approximation of a maximum function that is part of an objective function, wherein the set of lower bound expressions are constructed based on the objective function, partial derivatives of the objective function, the maximum value that can be represented by a computing architecture of the processor and/or can be handled by a numerical solver, and the minimum value that can be represented in the computing architecture of the processor and/or handled by the numerical solver;

evaluating the set of lower bound expressions to obtain a set of lower bound values;

determining a maximum lower bound value from the set of lower bound values; and while solving a gate sizing problem is being solved by the numerical solver, evaluating the objective function and the partial derivatives of the objective function by using the maximum lower bound value.

12. The apparatus of claim 11, wherein the numerical solver is a conjugate-gradient based numerical solver, and wherein the maximum lower bound value is computed for each net in the circuit design and reused in each numerical optimization iteration of the net.

13. The apparatus of claim 12, wherein said solving the gate sizing problem in the numerical solver includes:
 evaluating the objective function;
 evaluating a gradient of the objective function; and
 providing values of the objective function and the gradient to the conjugate-gradient based numerical solver.

14. The apparatus of claim 11, wherein the objective function is a differentiable objective function that optimizes delay in the circuit design.

15. The apparatus of claim 11, wherein the objective function includes a differentiable approximation of a function that returns a maximum value from a set of input values.

* * * * *